(12) United States Patent
Ogino et al.

(10) Patent No.: US 6,656,849 B2
(45) Date of Patent: Dec. 2, 2003

(54) PLASMA REACTOR

(75) Inventors: Satoshi Ogino, Tokyo (JP); Takahiro Maruyama, Tokyo (JP)

(73) Assignee: Mitsubishi Denki Kabushiki Kaisha, Tokyo (JP)

(*) Notice: Subject to any disclaimer, the term of this patent is extended or adjusted under 35 U.S.C. 154(b) by 0 days.

(21) Appl. No.: 10/228,999

(22) Filed: Aug. 28, 2002

(65) Prior Publication Data

US 2003/0000646 A1 Jan. 2, 2003

Related U.S. Application Data

(63) Continuation of application No. 08/848,881, filed on May 1, 1997, now Pat. No. 6,471,821.

(30) Foreign Application Priority Data

Nov. 20, 1996 (JP) ............................................. 8-309141

(51) Int. Cl.[7] ..................... H01L 21/461; H01L 21/469; H01L 21/306; C23C 16/00
(52) U.S. Cl. .................. 438/714; 438/758; 156/345.43; 118/723 E
(58) Field of Search ....................... 118/723 E, 723 ER, 118/723 I, 723 IR, 723 AN, 723 MR, 723 ME, 723 MA, 723 MW, 723 R; 438/710, 714, 723, 724, 726, 758; 216/67, 69, 79, 80; 134/1.1, 1.2, 1.3; 427/569, 574, 575, 578, 579; 204/192.22, 192.23, 192.37; 156/345.43, 345.44, 345.45, 345.46, 345.47, 345.48, 345.41

(56) References Cited

U.S. PATENT DOCUMENTS

| | | |
|---|---|---|
| 4,795,529 A | 1/1989 | Kawasaki et al. |
| 4,808,258 A | 2/1989 | Otsubo et al. |
| 4,891,118 A | 1/1990 | Ooiwa et al. |
| 5,160,397 A | 11/1992 | Dori et al. |
| 5,310,452 A | 5/1994 | Dori et al. |
| 5,435,886 A | 7/1995 | Fujiwara et al. |
| 6,110,287 A | 8/2000 | Arai et al. |
| 6,471,821 B2 * | 10/2002 | Ogino et al. ........... 156/345.44 |

FOREIGN PATENT DOCUMENTS

| | | |
|---|---|---|
| JP | 4-174514 | 6/1992 |
| JP | 6-267900 | 9/1994 |
| JP | 8-88218 | 4/1996 |
| JP | 8-139077 | 5/1996 |

* cited by examiner

*Primary Examiner*—Luz L. Alejandro
(74) *Attorney, Agent, or Firm*—Oblon, Spivak, McClelland, Maier & Neustadt, P.C.

(57) ABSTRACT

A plasma reactor is provided for achieving extension of etching parameters to reduce charge-up shape anomaly and to improve selectivity, uniformity and workability in a dry etching process. An RF power fluctuates in cycles, each one of the cycles including first and second subcycles (25), (26) with different frequencies. The RF power in the first subcycles (25) is higher in frequency than that in the second subcycles (26). A charge accumulated during the first subcycles (25) in which the RF power of high frequency is applied can be relieved during the second subcycles (26) in which the RF power of low frequency is applied. At the same time, deterioration in an etching rate occurring with the application of only the RF power of low frequency can be relieved by applying the RF power of high frequency during the first subcycles (25).

14 Claims, 14 Drawing Sheets

PLASMA REACTOR

This application is a continuation of U.S. application Ser. No. 08/848,881, filed on May 1, 1997, now U.S. Pat. No. 6,471,821.

BACKGROUND OF THE INVENTION

1. Field of the Invention

This invention is directed to a plasma reactor, especially to a dry etching apparatus.

2. Description of the Background Art

FIG. 20 is a sectional view generally showing an ECR (electron cyclotron resonance) etching apparatus which is a kind of conventional plasma processing apparatus. In a plasma production chamber 1, plasma is produced from process gas by a $\mu$ wave 19 and transferred to a reaction chamber 2. The plasma exposes wafers 7 biased by an RF power obtained by an RF power supply means 8.

There are various parameters for controlling an etching process in the ECR etching apparatus, including shape and position of an ECR face 5 (which also depends on a magnetic field provided by coils 4), the RF power, the $\mu$ wave 19, a method of electrostatic chuck for the wafers 7, pressure from process gas or the like.

An apparatus of high integration and a fine structure has made it more and more difficult to achieve etching with high anisotropy, high selectivity and high uniformity. There are many cases that the present etching parameters are not enough to achieve a desirable etching. Anomalies in etching shape due to charge-up (referred to as "charge-up shape anomaly" hereinafter) has been raised as one of problems to prevent the formation of a fine structure in recent years.

FIGS. 21 and 22 are enlarged sectional views in the vicinity of the surface of a semiconductor wafer 101, illustrating the charge-up shape anomaly. Each figure shows the behavior of ions (shown by circled "+") and electrons (shown by circled "−") when a fine pattern etching of the semiconductor wafer 101 is performed by means of a plasma etching.

In FIG. 21, an SiO2 film 13, an Si film 14 and a resist pattern 15 are formed one after another on the surface of the semiconductor wafer 101. The Si film 14 is etched with the resist pattern 15 as a mask. In this case, as etching proceeds, electrical neutrality is maintained by incidence of both ions and electrons on the surface of the resist pattern 15.

In a fine pattern 16, incidence of ions occurs perpendicular to the surface of the semiconductor wafer 101. Thus, ions can reach to a bottom surface 18 of the fine pattern 16 with no collision with side walls 17. On the other hand, electrons have no directional property to be incident on the side walls 17, thereby having difficulty in reaching to the bottom surface 18.

As shown in FIG. 21, when a conductive film such as the Si film 14 is etched, ions incident on the bottom surface 18 and electrons incident on the side walls 17 are recombined in the Si film 14 to be neutralized. Thus, electrical neutrality is maintained. On the other hand, when the bottom surface 18 moves downward due to the etching progress and exposes an insulating film such as the SiO2 film 13 as shown in FIG. 22, ions incident on the bottom surface 18 and electrons incident on the side walls 17 are not neutralized. Thus, the bottom surface 18 is positively charged up due to the ion incidence while the side walls 17 are negatively charged due to the electron incidence.

Therefore, the orbit of ions incident on the bottom surface 18 is bent by repulsion of positive charge on the bottom surface 18 and gravitation of negative charge on the side walls 17. This causes local incidence of ions on the interface between the Si film 14 and the SiO2 film 13, and then produces a V-shaped notch (reference character A shows notch amount).

To decrease such charge-up shape anomaly, a method for pulsing the $\mu$ wave 19 or the RF power (to repeat ON/OFF periods thereof) has been advocated. When both of the $\mu$ wave 19 and the RF power are in the ON period, normal discharge occurs, causing progress in charge-up in a fine pattern. On the contrary, when either of the $\mu$ wave 19 or the RF power is in the OFF period, incidence of electrons on the bottom surface 18 is made possible by no directional difference between ions and electrons, thereby dissolving charge-up. That is, charge-up proceeded during the ON period can be dissolved during the OFF period.

Such control over the movement of charged particles is very important not only for dissolution of shape anomalies but also for control of a selectivity ratio and uniformity. The method for pulsing conventional $\mu$ wave 19 and RF power is however limited, so that extension of pulse methods has been required for controlling broader etching parameters.

SUMMARY OF THE INVENTION

According to a first aspect of the present invention, a plasma reactor comprises a stage to which a frequency-modulated RF power is applied; and a reaction chamber containing plasma exposed to a sample mounted on the stage.

According to a second aspect of the present invention, a plasma reactor comprises a stage to which an RF power is applied; and a reaction chamber containing plasma exposed to a sample mounted on the stage, wherein the RF power fluctuates in cycles, each one of the cycles consisting of a plurality of first and second subcycles with the RF power of different amplitudes, wherein the plurality of first subcycles has different lengths, respectively.

According to a third aspect of the present invention, a plasma reactor comprises a stage to which an RF power is applied; and a reaction chamber containing plasma exposed to a sample mounted on the stage, wherein the RF power presents a waveform in which an AC waveform with a predetermined initial phase is intermittently superimposed on a DC value.

According to a fourth aspect of the present invention, an intermittently supplied $\mu$ wave produces the plasma.

According to the plasma reactor of the first aspect of the present invention, accumulation of charge occurring with the RF power of high frequency can be relieved with the RF power of low frequency. At the same time, deterioration in an etching rate, which is regarded as one of problems when only the RF power of low frequency is applied, can be relieved with the RF power of high frequency.

According to the plasma reactor in the second aspect of the present invention, in one cycle that the RF power fluctuates, the first subcycles have different lengths, respectively. Thus, charge-up can be relieved during one of the subcycles while deterioration in an etching rate can be suppressed during the other of the subcycles.

According to the plasma reactor in the third aspect of the present invention, an area more positive than DC components becomes larger than that more negative than DC components in the range of superimposition of RF components by setting the initial phase within the range of 180° to 360°. This results in improvement in a notch amount and a selectivity ratio. Further, the area more positive than DC components becomes smaller than that more negative than DC components in the range of superimposition of RF components by setting the initial phase within the range of 0° to 180°. This results in improvement in a CD gain and an etching rate.

According to the fourth aspect of the present invention, an intermittent introduction of the $\mu$ wave into the plasma reactor leads to reduction in a notch amount. Further, an intermittent application of the RF power to the stage leads to a remarkable effect in improving etching characteristics.

The object of this invention is to provide a plasma reactor capable of extending etching parameters for reducing charge-up shape anomaly in dry etching and for improving etching performance such as selectivity, uniformity and workability.

These and other objects, features, aspects and advantages of the present invention will become more apparent from the following detailed description of the present invention when taken in conjunction with the accompanying drawings.

DESCRIPTION OF THE PREFERRED EMBODIMENTS

<First Preferred Embodiment>

Figure 1:
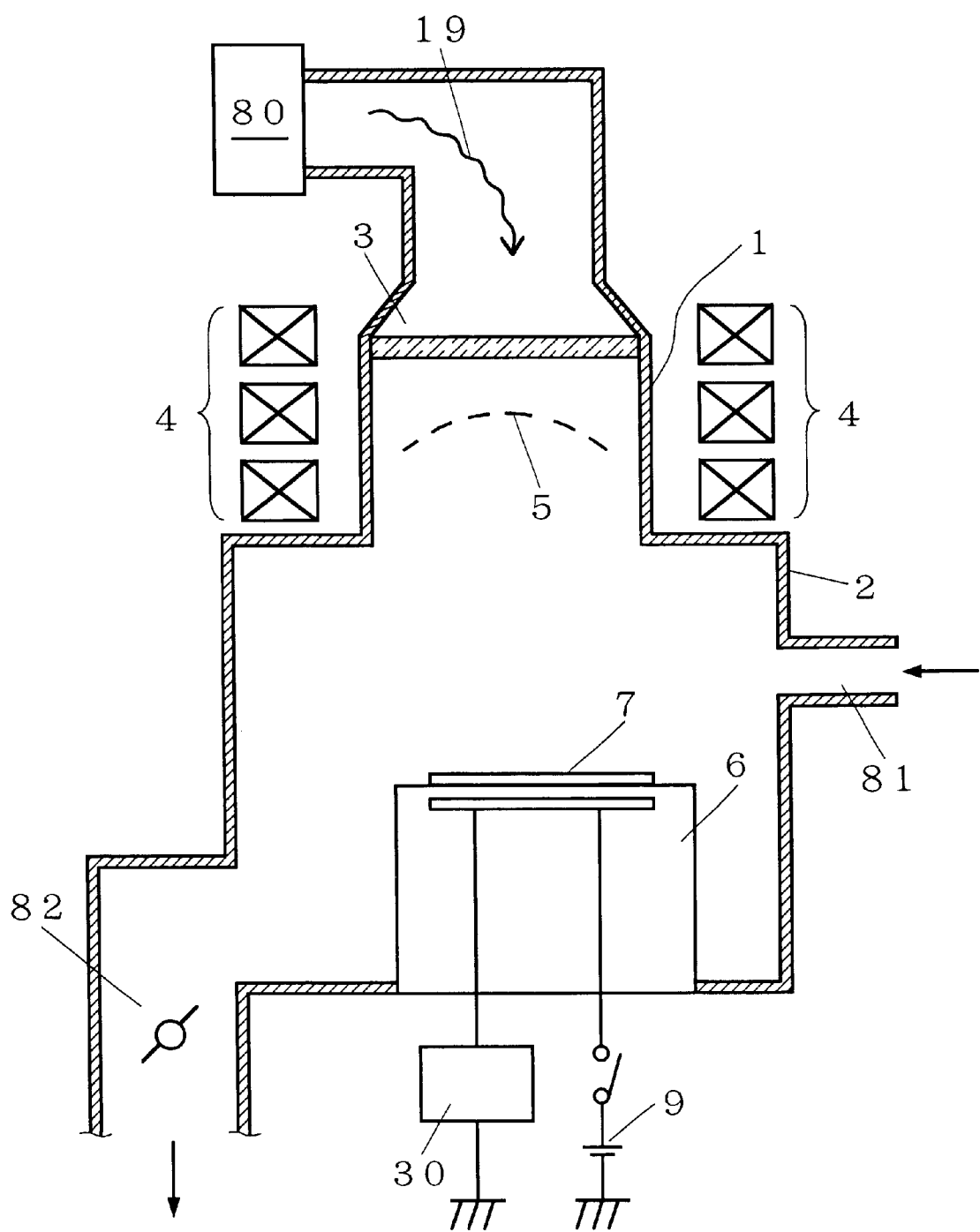
FIG. 1 is a sectional view showing an ECR etching apparatus in accordance with a first preferred embodiment of the present invention.

FIG. 1 is a sectional view generally showing an ECR etching apparatus as a plasma reactor according to a first preferred embodiment of the present invention. A chamber in the ECR etching apparatus is roughly divided into a plasma production chamber 1 and a reaction chamber 2. A reactive process gas is introduced into the chamber from an inlet 81 and is exhausted from an outlet 82, so that a predetermined pressure is maintained. A microwave 19 of 2.45 GHz generated from a $\mu$ wave power 80 passes through a waveguide to be introduced into the chamber via a leading window 3.

Since a magnetic field is applied in the chamber by coils 4, an ECR resonance region (ECR surface) exists in the plasma production chamber 1 to produce an ECR plasma. The magnetic field generated by the coils 4 diverges from the plasma production chamber 1 to the reaction chamber 2, so that the ECR plasma is carried to wafers 7 mounted on a stage 6. This ECR plasma etches the wafers 7.

Further, the stage 6 on which the wafers 7 are mounted is connected to an RF power source supply device 30 for supplying the RF power for etching, which will be described in detail later. Further, the wafers 7 are induced by static electricity generated by a power source 9 to contact with the stage 6 (referred to as electrostatic chuck) for cooling.

Figure 2:
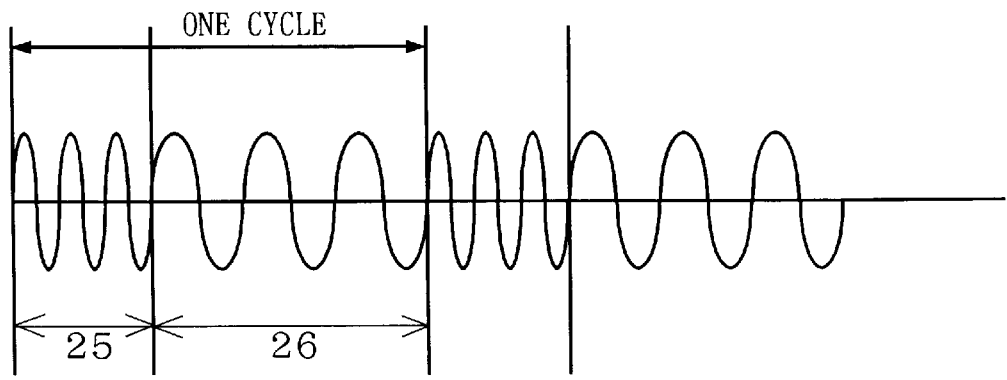
FIG. 2 is a graph showing a waveform of an RF power in accordance with the first preferred embodiment of the present invention.

FIG. 2 is a graph showing a waveform of an RF power generated by the RF power supply device 30. The frequency of the RF power applied in the first preferred embodiment is pulse-modulated. The RF power fluctuates in cycles, each one the cycles consisting of first and second subcycles 25, 26 with different frequencies. The graph indicates that the RF power in the first subcycle 25 is higher in frequency than that in the second subcycles 26.

In general, the RF power of high frequency produces a high self-bias voltage. This increases an ion energy to remarkably raise an etching rate while increasing charge due to a heavy directional movement of ions.

On the contrary, the RF power of low frequency produces a low self-bias voltage. This prevents charge-up, but results in a low etching rate and small anisotropy. Thus, a continuous application of only the RF power of low frequency has not been put to practical use in general.

According to the first preferred embodiment, the RF power of high frequency and the RF power of low frequency are applied in turn. Thus, accumulation of charge during the first subcycle 25 in which the RF power of high frequency is applied can be relieved during the second subcycle 26 in which the RF power of low frequency is applied. Further, a decline in the etching rate, which is regarded as one of problems when only the RF power of low frequency is applied, can be relieved by applying the RF power of high frequency in the first subcycle 25.

<Second Preferred Embodiment>

The alternating application of the RF power of high frequency and of low frequency is not necessarily in the form of pulse to obtain the same effect as described in the first preferred embodiment. If only the frequency fluctuates, the fluctuation does not have to be rapid.

Figure 3:
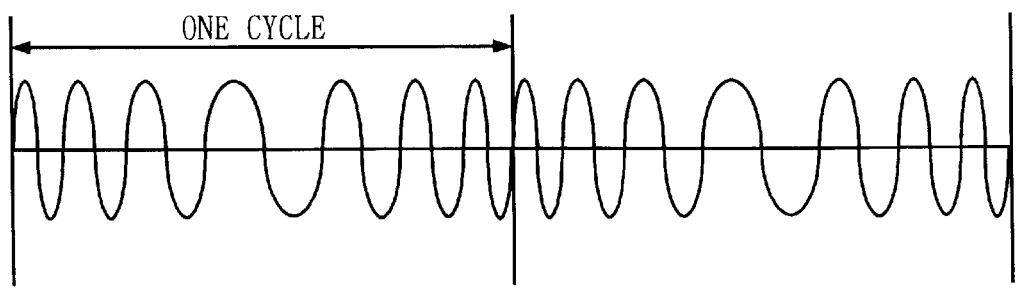
FIG. 3 is a graph showing a waveform of an RF power in accordance with a second preferred embodiment of the present invention.

FIG. 3 is a graph showing a waveform of an RF power according to a second preferred embodiment of the present invention. The ECR etching apparatus shown in FIG. 1 is applied as well in the second preferred embodiment. The RF power fluctuates in cycles. In each one of the cycles, the frequency of the RF power fluctuates with constant amplitude, showing a frequency-modulated waveform. In this case, the aforementioned effect can be obviously obtained.

<Third Preferred Embodiment>

It has been a well-known technique to apply pulsed RF power to the wafers 7. According to the technique, charge accumulated during an ON period of the RF power is relieved during its OFF period, while an etching rate is increased during the ON period.

Figure 4:
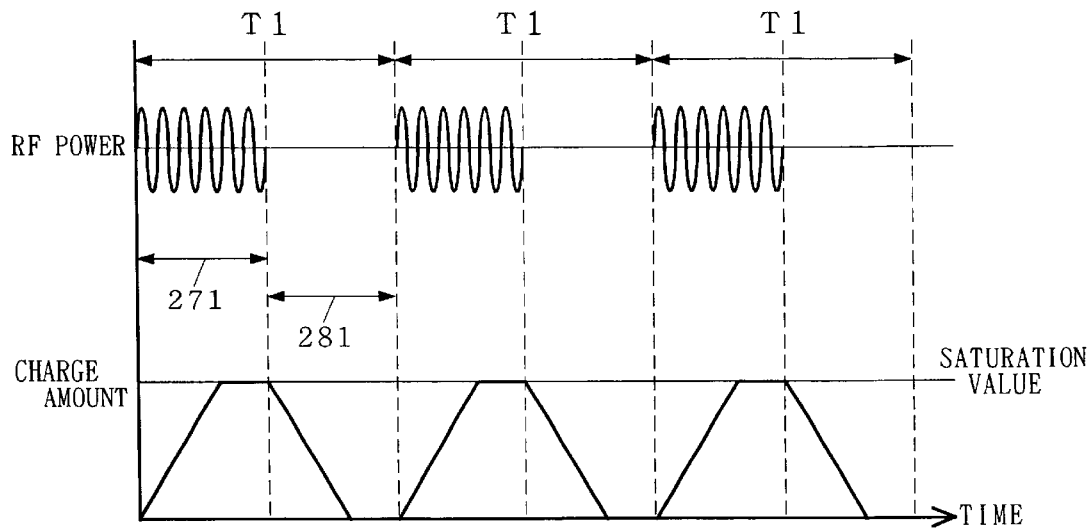
FIGS. 4, 5 and 6 are timing charts showing correlation between ON/OFF periods of a pulsed RF power and a charge-up amount.

FIG. 4 is a timing chart showing correlation between ON/OFF periods of a conventional pulsed RF power and a charge amount (strength of a local electric field caused by accumulated charge). Cycles T1 of the RF power fluctuating in cycles consist of an ON period 271 and an OFF period 281 of the same lengths.

When the OFF period 281 is long, accumulation of charge is relieved. However, etching progress stops due to disappearance of plasma during the period, reducing an etching rate in the etching period as a whole. Further, since the ON period 271 lasts long as well in such case, accumulation of charge reaches to a saturation value. Then, a long lasting charge-up period is apt to cause shape anomalies.

Figure 5:
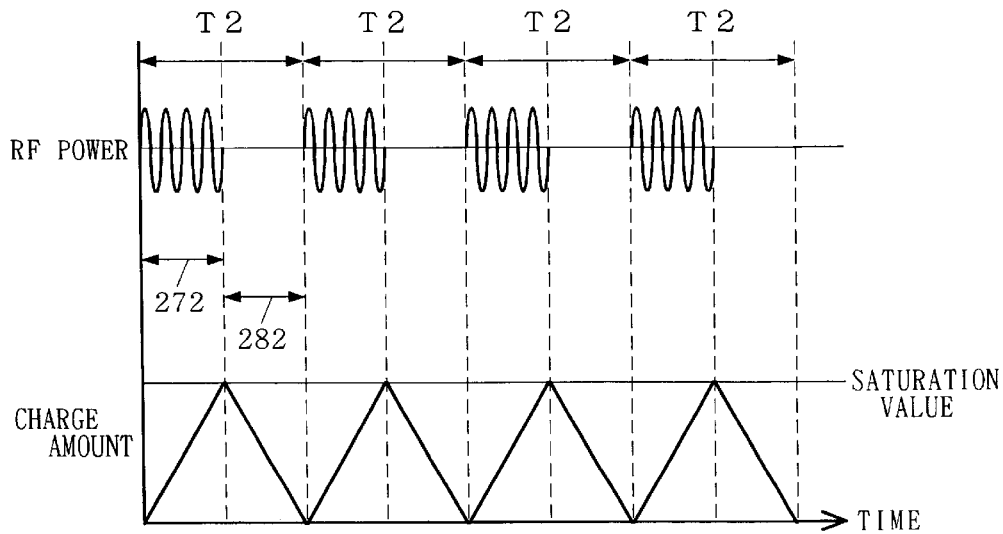

FIG. 5 is a timing chart showing correlation between a charge amount and ON/OFF periods of an RF power with cycles T2 which consists of an ON period 272 and an OFF period 282 both shorter than the ON/OFF periods 271, 281, in order to avoid the aforementioned problem discussed about FIG. 4. In this case, charge accumulated during the ON period 272 is suppressed, so that less shape anomaly occurs. An early end of the ON period 272, however, prevents an adequate rise of a self-bias potential, so that an etching rate is decreased as compared with the example shown in FIG. 4.

Figure 6:
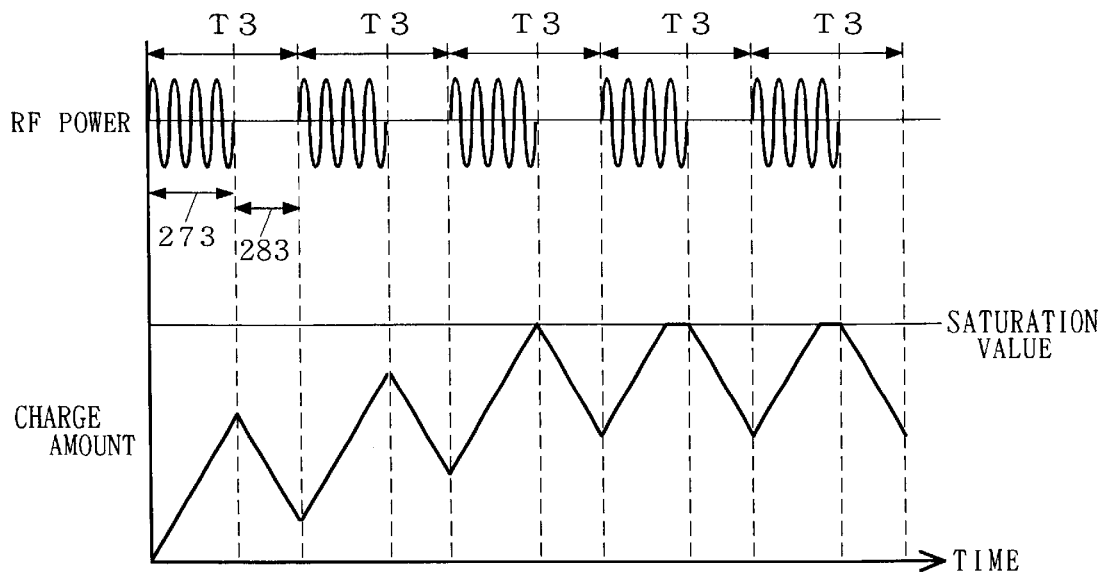

FIG. 6 is a timing chart showing correlation between a charge-up amount and ON/OFF periods of an RF power with cycles T3 which consists of an ON period 273, and an OFF period 283 shorter than the ON period 273, in order to avoid the aforementioned problem discussed about FIG. 5. In this case, an etching rate can be increased during the ON period 273 without interfering with a rise of a self-bias potential. It is, however, impossible to sufficiently relieve accumulation of charge during the OFF period 283, so that accumulated charge will reach to a saturation value (i.e. charge-up) after several cycles.

Figure 7:
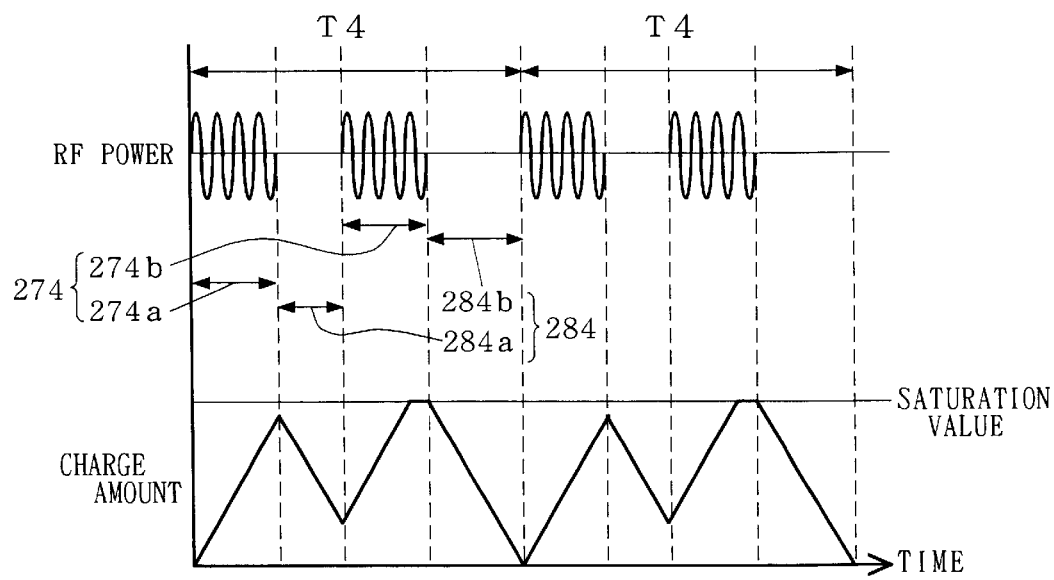
FIG. 7 is a timing chart showing correlation between ON/OFF periods of a pulsed RF power and a charge amount in accordance with a third preferred embodiment of the present invention.

FIG. 7 is a timing chart showing correlation between ON/OFF periods of an RF power and a charge amount according to a third preferred embodiment of the present invention. The timing may be used in the ECR etching apparatus shown in FIG. 1 is applied as well in the third preferred embodiment.

The RF power applied in the third preferred embodiment fluctuates in cycles, each one of the cycles T4 consisting of a group of first subcycles 284 and a group of second subcycles 274 with different amplitudes. The group of first subcycles 284 includes first subcycles 284a and 284b with amplitudes of zero and different lengths (both are OFF periods). The group of second subcycles 274 includes second subcycles 274a and 274b with the same amplitudes and lengths (both are ON periods). These subcycles 274a, 284a, 274b and 284b appear in turns.

As described above, the ON/OFF periods of the RF power are modulated by means of PCM (pulse code modulation). In other words, the length of the ON periods is constant while that of the OFF periods changes from long to short in cycles.

Since the cycles T4 in which the RF power fluctuates include the OFF periods 284a and 284b of different length in this way, accumulation of charge can be relieved during the longer period thereof while a decline in the etching rate can be suppressed during the shorter period. In other words, it is possible to accumulate less charge as compared with the example shown in FIG. 4 and a high etching rate as compared with the example shown in FIG. 5.

<Fourth Preferred Embodiment>

Figure 8:
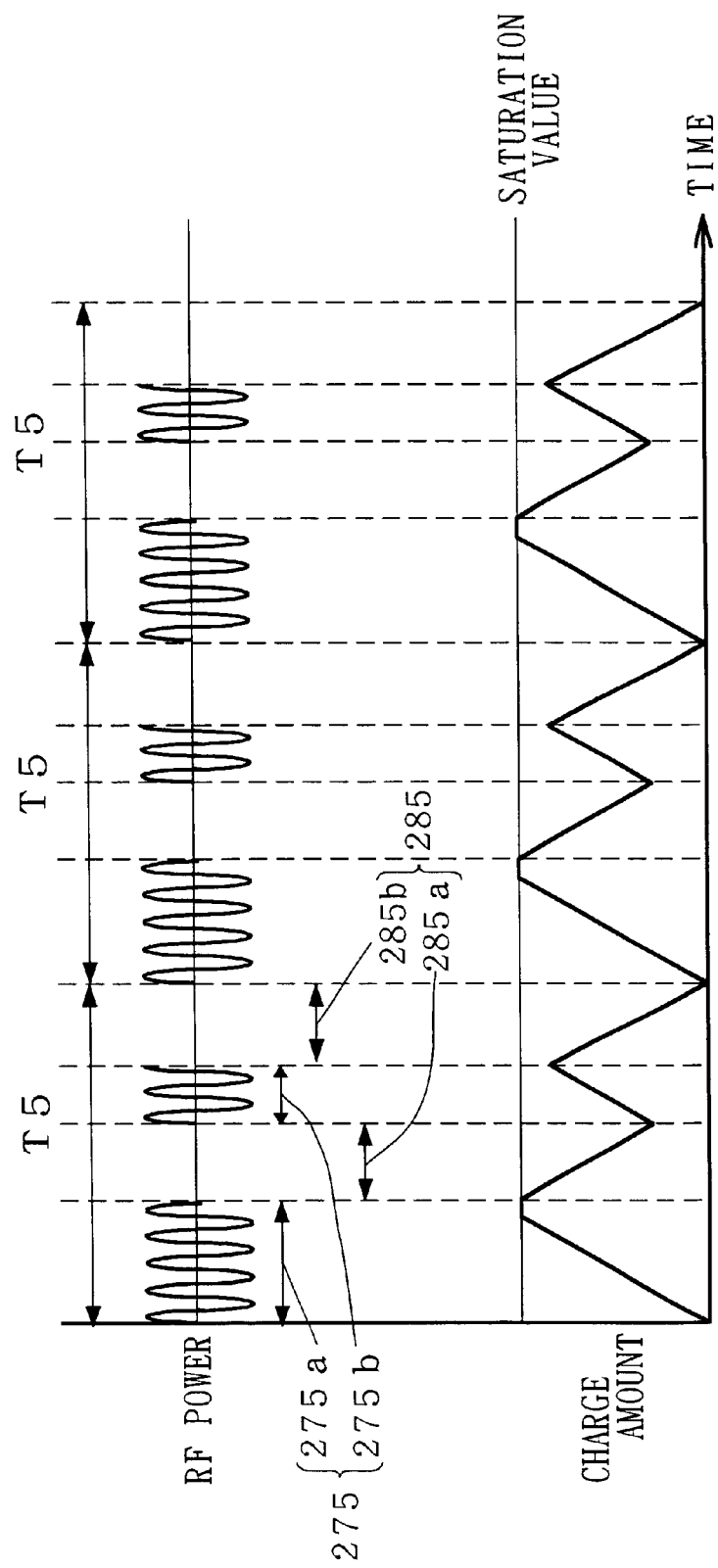
FIG. 8 is a timing chart showing correlation between ON/OFF periods of a pulsed RF power and a charge amount in accordance with a fourth preferred embodiment of the present invention.
Figure 9A:
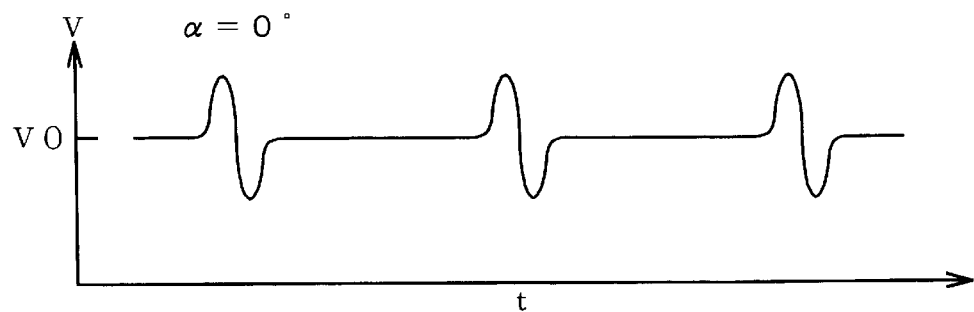
FIGS. 9A–9D are graphs showing a waveform of a voltage V in accordance with a fifth preferred embodiment of the present invention.
Figure 9B:
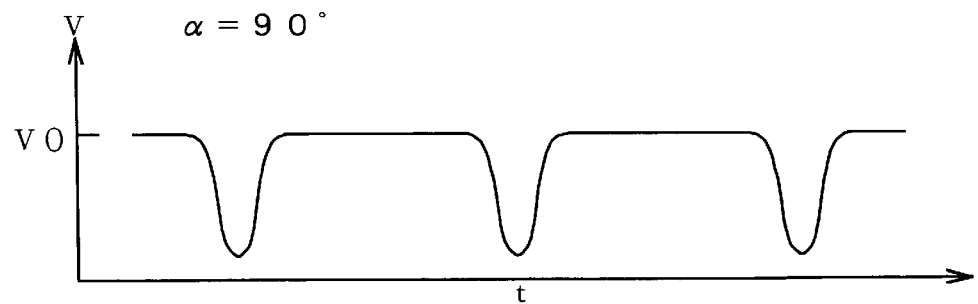
Figure 9C:
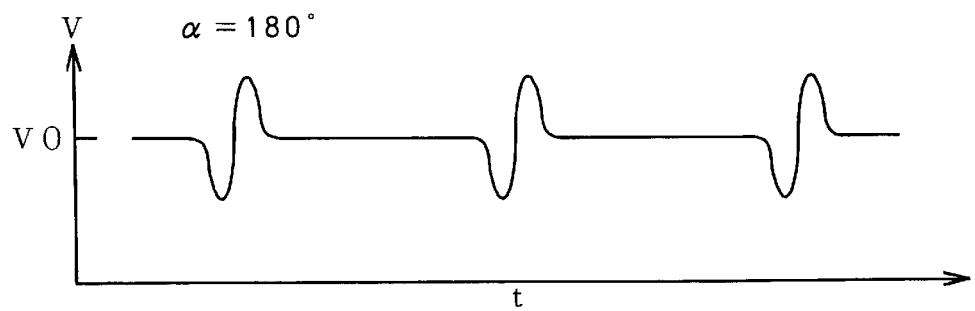
Figure 9D:
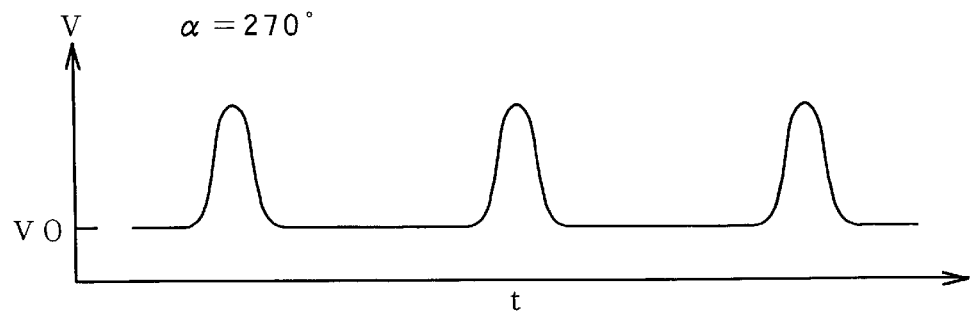

When an RF power fluctuates in cycles, it may be ON periods, not OFF periods, to have subcycles of different length. FIG. 8 is a timing chart showing correlation between ON/OFF periods of an RF power and a charge amount according to a fourth preferred embodiment of the present invention. The ECR etching apparatus shown in FIG. 1 is applied as well in the fourth preferred embodiment.

Cycles T5 of the RF power consists of a group of first subcycles 275 and a group of second subcycles 285 with different amplitudes. The group of first subcycles 275 includes first subcycle 275a, 275b with the same amplitudes and different lengths (both are ON periods). The group of second subcycles 285 includes second subcycles 285a, 285b with amplitudes of zero and the same lengths (both are OFF periods). These subcycles 275a, 285a, 275b and 285b appear in turns.

As described above, the ON/OFF periods of the RF power are modulated by means of PWM (pulse width modulation). In other words, the length of the OFF periods is constant while that of the ON periods changes from long to short in cycles.

Since the cycles T5 in which the RF power fluctuates include the ON periods 275a, 275b of different length in this way, accumulation of charge can be relieved during the shorter period thereof while a decline in an etching rate can be suppressed during the longer period. In other words, it is possible to accumulate less charge as compared with the example shown in FIG. 4 and a high etching rate as compared with the example shown in FIG. 5.

<Fifth Preferred Embodiment>

FIG. 9 shows waveforms of an RF power according to a fifth preferred embodiment of the present invention. The waveforms maybe used in the ECR etching apparatus shown in FIG. 1 as well in the fifth preferred embodiment. In this case, the RF power supply device 30 can perform not only modulation of RE frequency and ON/OFF switching of the pulsed RF power but also superimposition of RF components on DC components. The combination of a random waveform generator, and a high-speed and wideband power amplifier can achieve such structure.

Suppose a time t to start an ON cycle in pulse of RF components is zero (t=0), a voltage applied to an output side of the RF power supply device 30 can be expressed as $V = A\sin(\omega t + \alpha) + V_0$, where A is amplitude of the RF power, $\omega$ is an angular frequency of the RF power, $\alpha$ is an initial phase, and $V_0$ is a central value of the voltage (DC components). If $V_0 = -A\sin(\alpha)$, for example, the voltage V at a starting time becomes zero.

FIGS. 9A to 9D show the voltage V of the RF power when $\alpha = 0°$, 90°, 180° and 270°, respectively, where each ON period in pulse includes only one cycle of RF components. As for the RF power, when RF components are superimposed in the form of pulse on DC components, change in the initial phase α for the RF components is effective for reduction in charge-up and control of a selectivity ratio.

Figure 10:
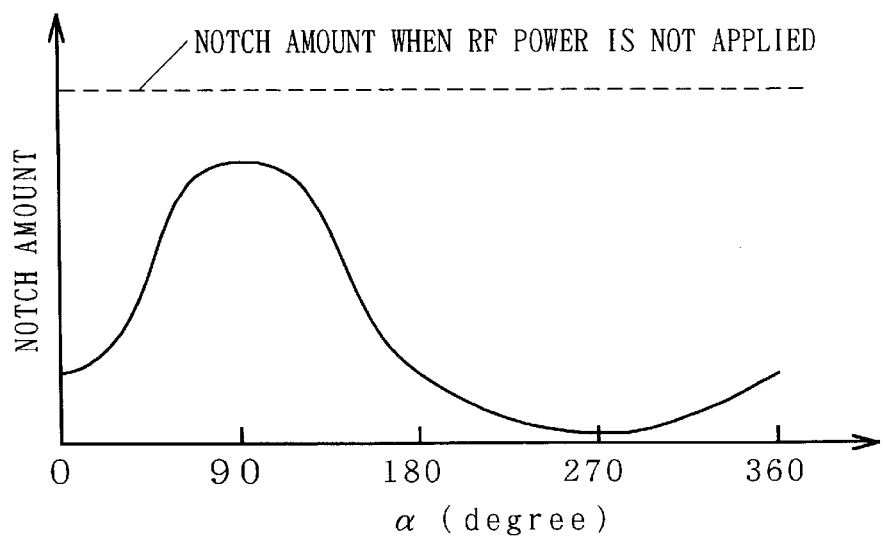
FIG. 10 is a graph showing the dependency of a notch amount on an initial phase.

FIG. 10 is a graph showing the dependency of a notch amount on an initial phase. Compared with the case that an RF power is not applied (shown by a broken line), the application of a pulsed RE power reduces a notch amount. The ratio of reduction depends on the value of an initial phase α. When the phase is 90°, the application of the RE power accelerates ions in the direction of a substrate while decelerating electrons and reducing an electron current. Thus, positive charge-up at the bottom portion of a pattern is not dissolved while negative charge accumulated on the side wall of the pattern is reduced, which results in little effect in improving notch. On the contrary, when the initial phase α is 270°, a retarding electrical field of electrons weakens and reduces accumulation of charge at the bottom portion of the pattern. Thus, notch prevention is remarkably improved.

Figure 11:
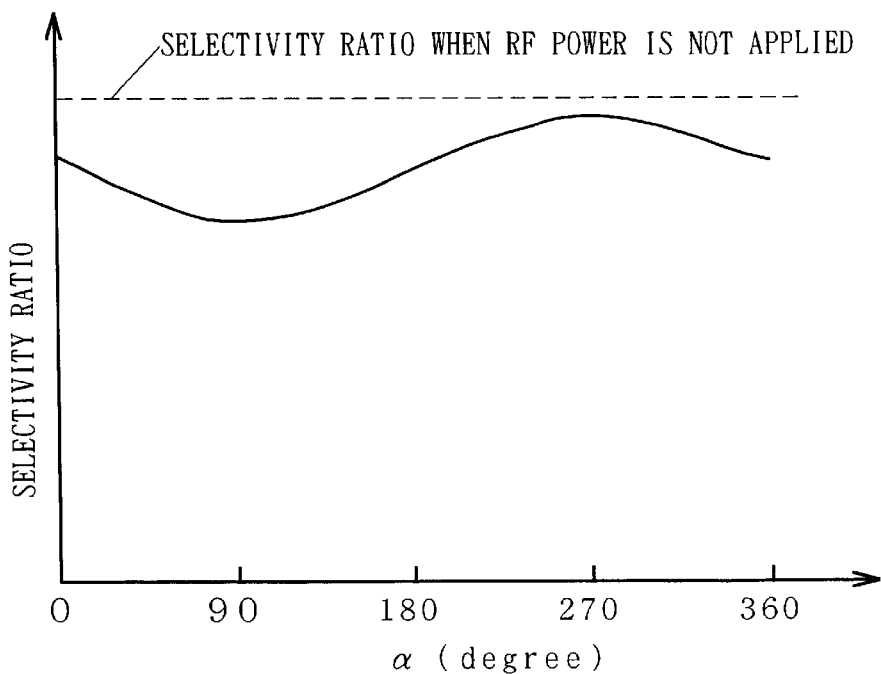
FIG. 11 is a graph showing the dependency of a selectivity ratio on an initial phase.

FIG. 11 is a graph showing the dependency of a selectivity ratio on an initial phase. Compared with the case that an RF power is not applied (shown by a broken line), the selectivity ratio falls (deteriorates) due to the application of a pulsed RF power. The ratio of the fall depends on the value of an initial phase α. The initial phase α of 90° has the greatest fall of the selectivity ratio while the initial phase α of 270° has the least.

That is, in order to obtain good notch amount and selectivity ratio, it is desirable to set the initial phase α at the range of 180° to 360°, more preferably at 270° so that an area more positive than DC components is greater than that more negative than DC components in the range of the voltage V with RF components superimposed.

Figure 12:
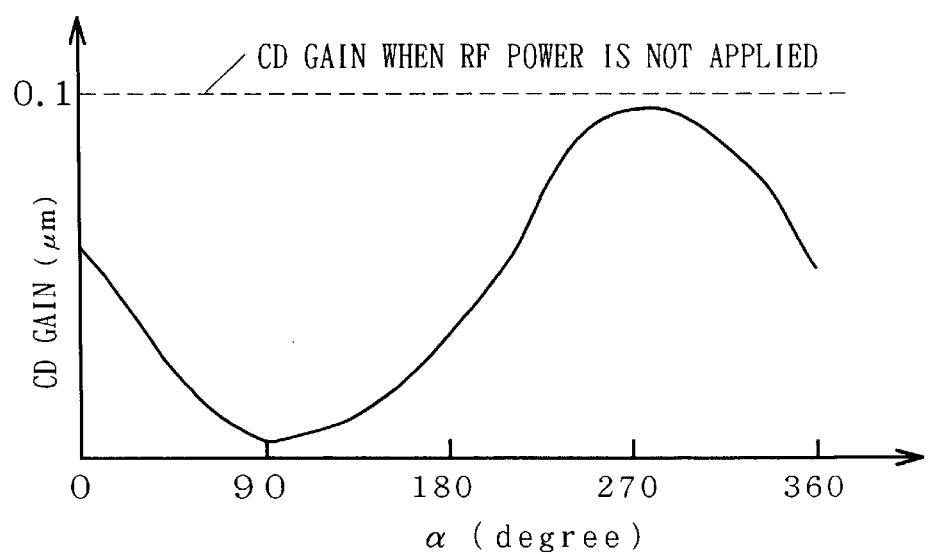
FIG. 12 is a graph showing the dependency of a CD gain on an initial phase.
Figure 13:
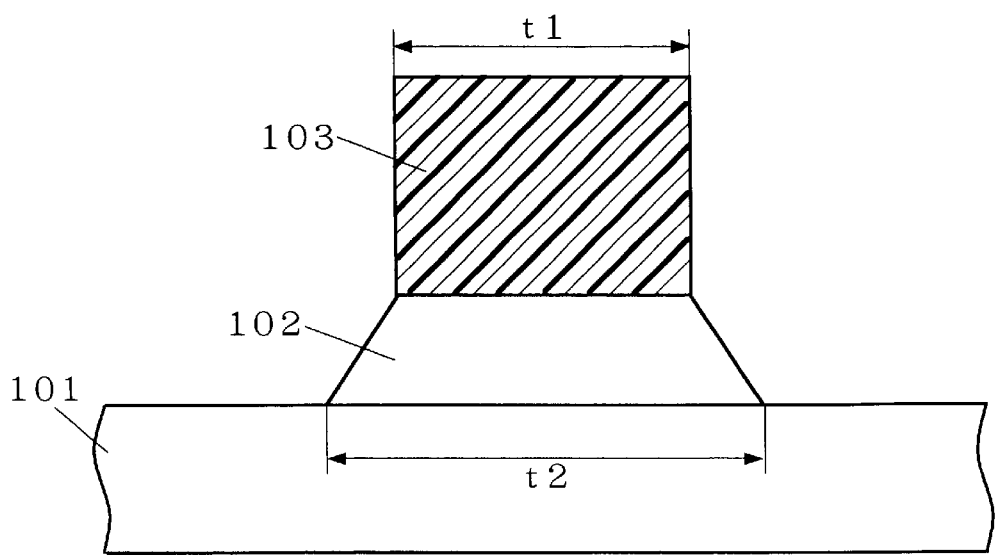
FIG. 13 is a sectional view illustrating the CD gain.

FIGS. 12 and 13 are a graph showing the dependency of a CD gain (critical dimension gain) on an initial phase, and a sectional view illustrating the CD gain, respectively. A film 102 provided on a substrate 101 is etched with a resist 103 as a mask. The CD gain can be found by the value of t2−t1, where the width of the resist 103 is t1 and the width of the bottom portion of the film 102 to be etched is t2. Compared with the case that an RF power is not applied (shown by a broken line), the application of a pulsed RF power improves the CD gain. The ratio of the improvement depends on the value of an initial phase α. The initial phase α of 90°, for example, brings about the greatest improvement in the CD gain while the initial phase α of 270° brings about the least.

Figure 14:
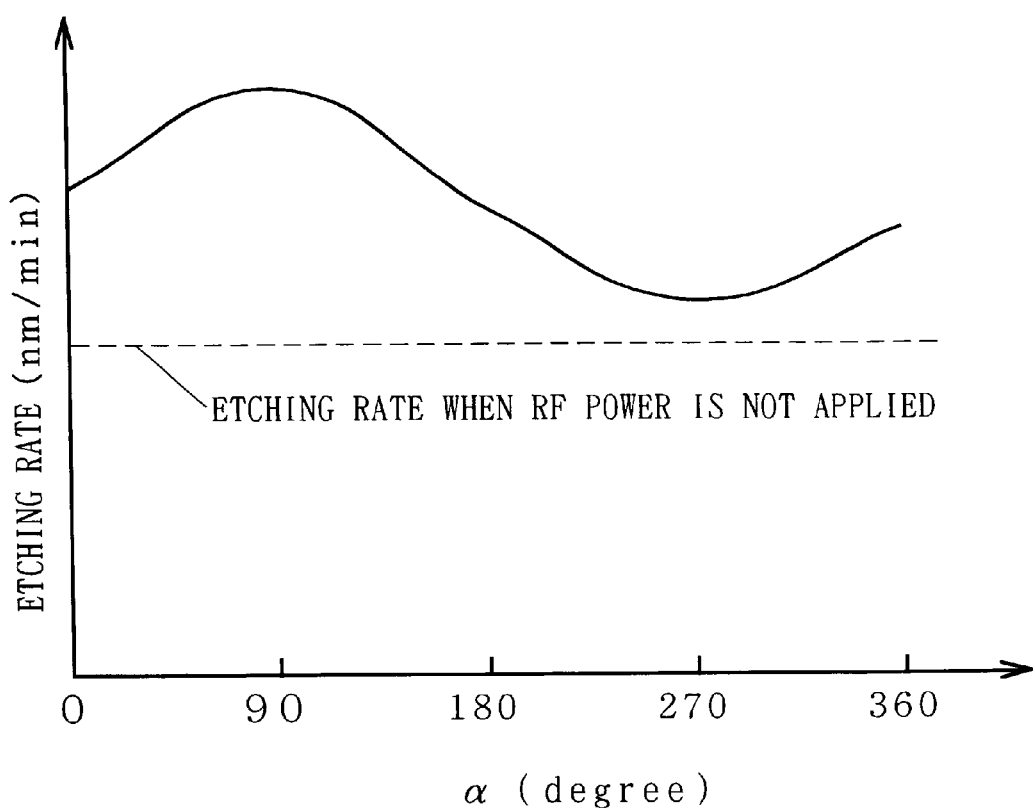
FIG. 14 is a graph showing the dependency of an etching rate on an initial phase.

FIG. 14 is a graph showing the dependency of an etching rate on an initial phase. Compared with the case that an RF power is not applied (shown by a broken line), the application of a pulsed RF power increases an etching rate. The ratio of the increase depends on the value of an initial phase α. The initial phase α of 90°, for example, gives the greatest increase while the initial phase α of 270° gives the least.

That is, in order to obtain good CD gain and etching rate, it is desirable to set the initial phase α at the range of 0° to 180°, more preferably at 90° so that an area more positive than DC components becomes smaller than that more negative than DC components in the range of the voltage V with RF components superimposed.

As explained above, desirable etching characteristics can be obtained by controlling the initial phase α. Likewise, change in the initial voltage V0 has effect in controlling accumulation of charge, a selectivity ratio, a CD gain and an etching rate.

<Sixth Preferred Embodiment>

As for an RF power, when RF components are superimposed in the form of pulse on DC components, the RF components may include a plurality of cycles.

Figure 15:
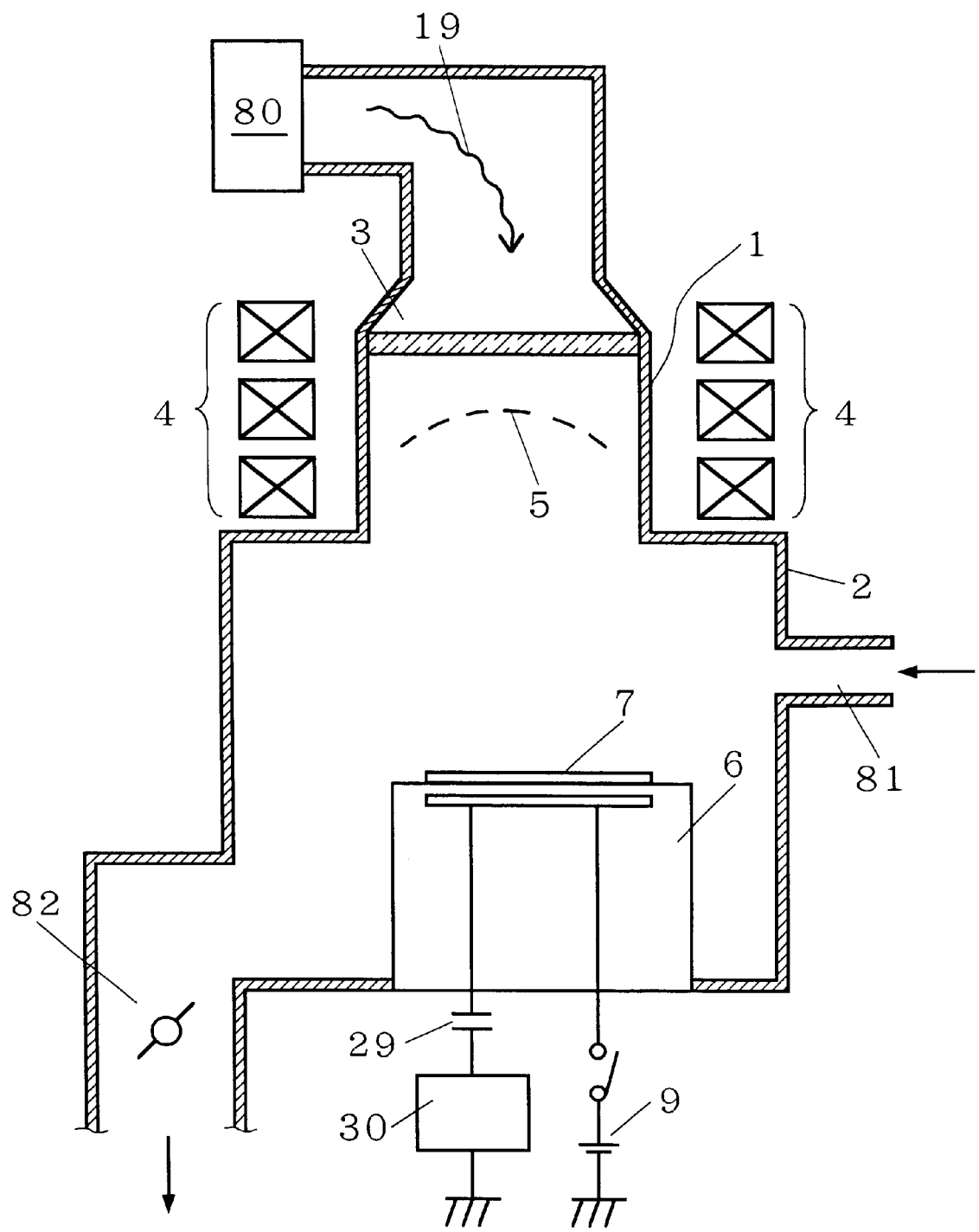
FIG. 15 is a sectional view showing an ECR etching apparatus in accordance with a sixth preferred embodiment of the present invention.

FIG. 15 is a sectional view showing an ECR etching device applied in a sixth preferred embodiment of the preferred embodiment. Compared with the structure shown in FIG. 1, the structure of this preferred embodiment is different only in that the RF power supply device 30 is connected to the stage 6 via a blocking capacitor 29.

Figure 16A:
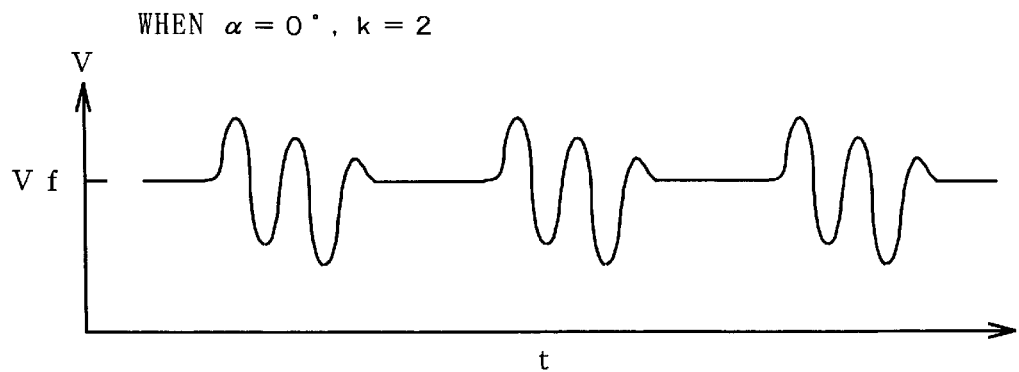
FIGS. 16A–16B are graphs showing change in potential at a stage 6 on the basis of an initial phase.
Figure 16B:
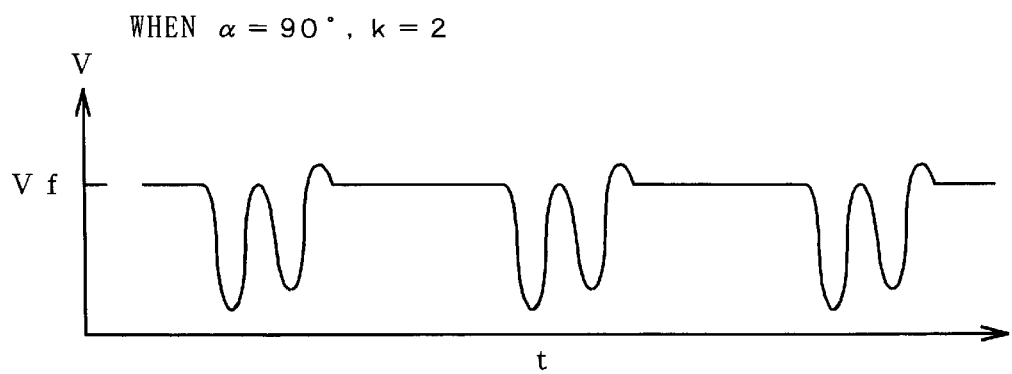

FIGS. 16A and 16B are graphs showing change in potential of the stage 6 from the initial phase α of 0° to 90°, where the number of cycles k is 2.

Figure 17:
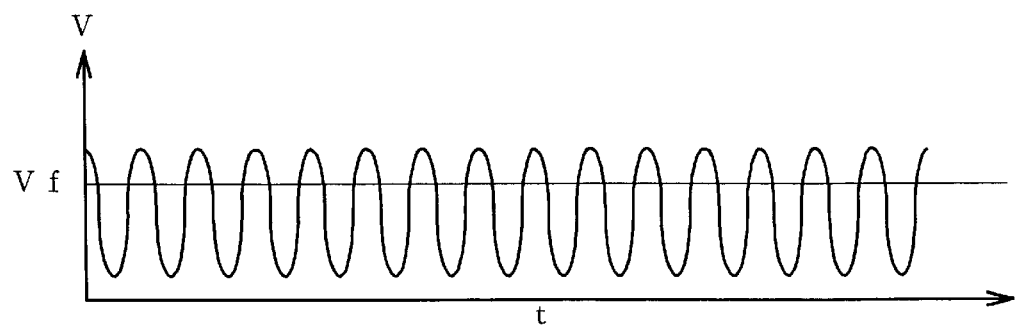
FIG. 17 is a graph showing potential at the stage 6 when an RF power is continuously applied.

Since the stage 6 is connected to the RF power supply device 30 via the blocking capacitor 29, potential of the stage 6 with no application of the RF power is equal to a floating potential Vf. FIG. 17 is a graph showing potential of the stage 6 when the RF power is continuously applied. The amount that the maximum potential of the stage 6 goes over the floating potential Vf is smaller than that the minimum potential of the stage 6 goes below the floating potential Vf. As the number of cycles k is increased, change in potential of the stage 6 has less dependency on the initial phase α, getting closer to the graph shown in FIG. 17. That is, the number of times to induce ions into the stage 6 increases. Thus, a constant initial phase α leads to an increase in an ion energy, reduction in a notch amount and a fall of a selectivity ratio.

As described above, it becomes possible to control a notch amount and a selectivity ratio by setting the number of cycles k or the initial phase α during the ON period of the pulsed RF power. Even if the RF power is continuously applied, an ion energy can be controlled by setting only a voltage or an electric power. However, further fine control can be achieved by control of the number of cycles k and the initial phase α.

<Seventh Preferred Embodiment>

Figure 18:
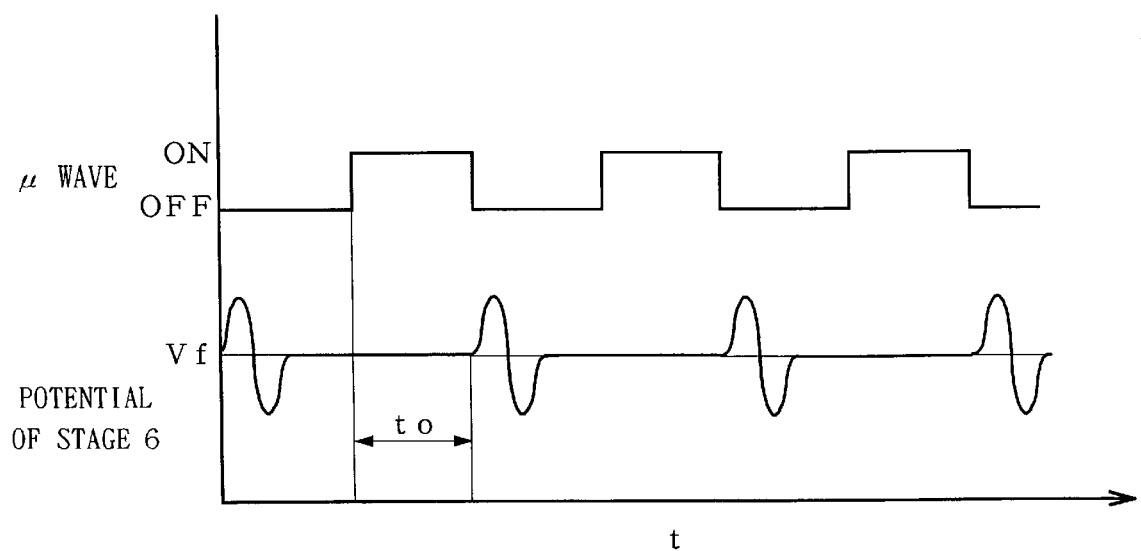
FIG. 18 is a graph showing a waveform of an RF power in accordance with a seventh preferred embodiment of the present invention.

FIG. 18 is a graph showing a waveform of an RF power according to a seventh preferred embodiment of the present invention. The waveforms maybe used in the ECR etching apparatus shown in FIG. 15 as well in the seventh preferred embodiment. A μ wave power source 80 generates a μ wave 19 in the form of pulse (intermittently).

An introduction of the pulsed μ wave 19 into a plasma reactor brings about reduction in a notch amount, which is taught, for example, by Jpn. J. Appl. Phys. 35(1996) p2450. According to this preferred embodiment, the plasma reactor not only generates plasma from the pulsed μ wave but also provides the pulsed RF power, which is described in the fifth and sixth preferred embodiments, with the stage 6. The combination of such techniques has a remarkable effect in improving etching characteristics such as reduction in a notch amount.

Figure 19:
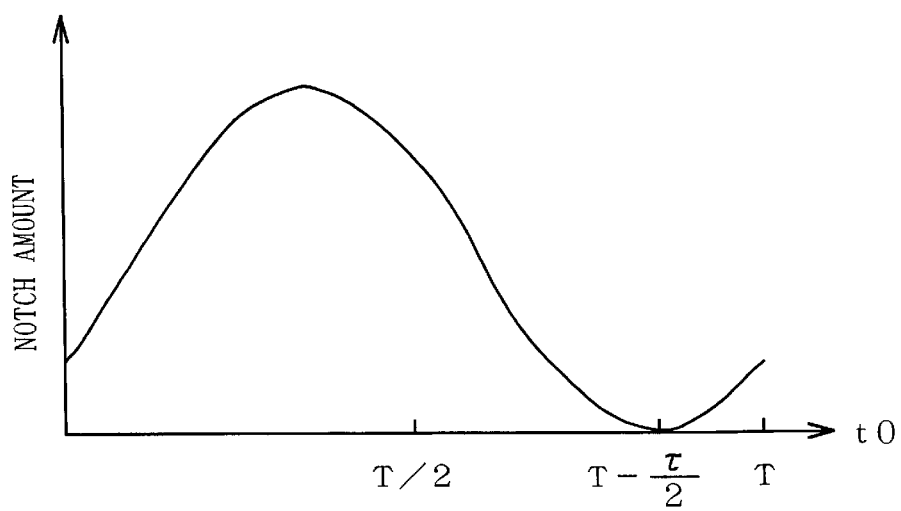
FIG. 19 is a graph showing correlation between a delay time t 0 and a notch amount.
Figure 20:
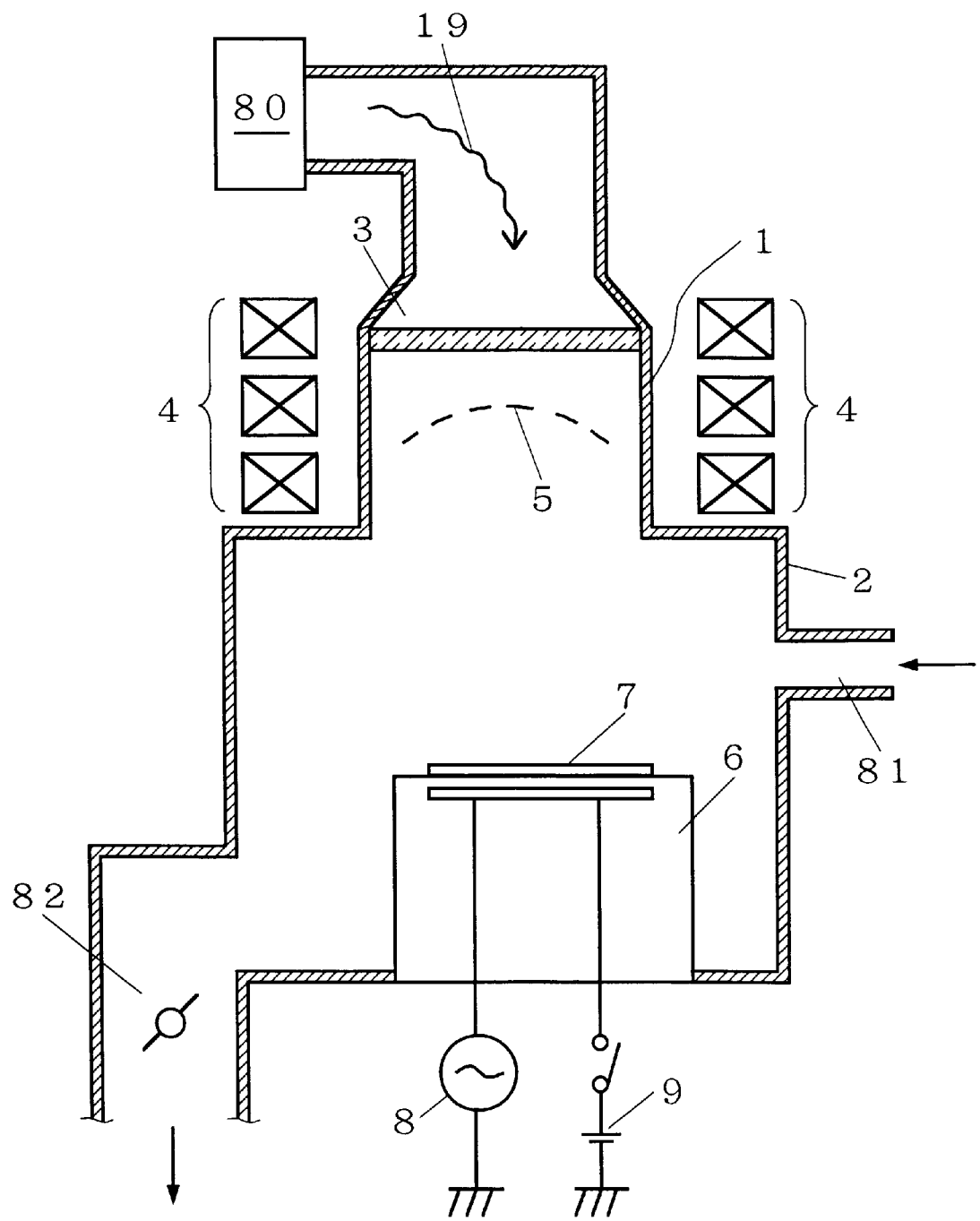
FIG. 20 is a sectional view showing a conventional ECR etching apparatus.
Figure 21:
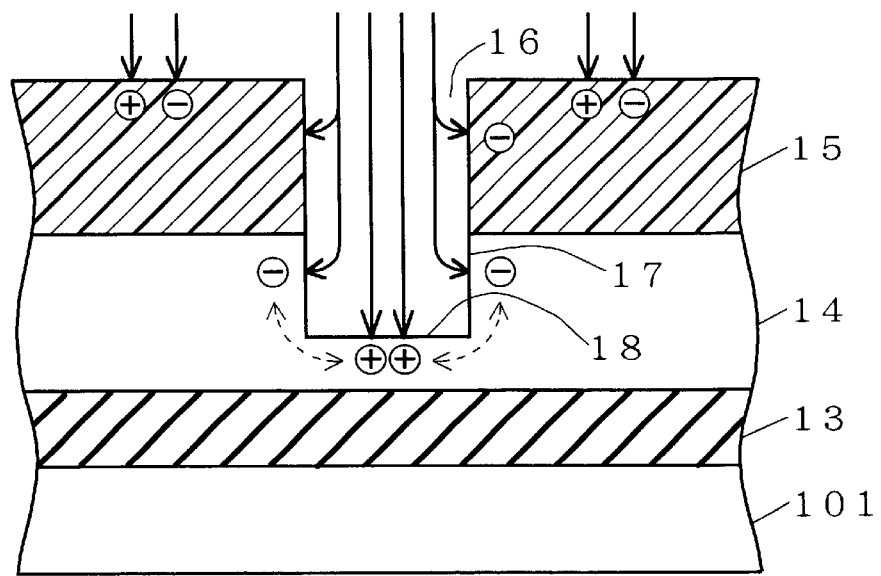
FIGS. 21 and 22 are sectional views illustrating charge-up shape anomaly.
Figure 22:
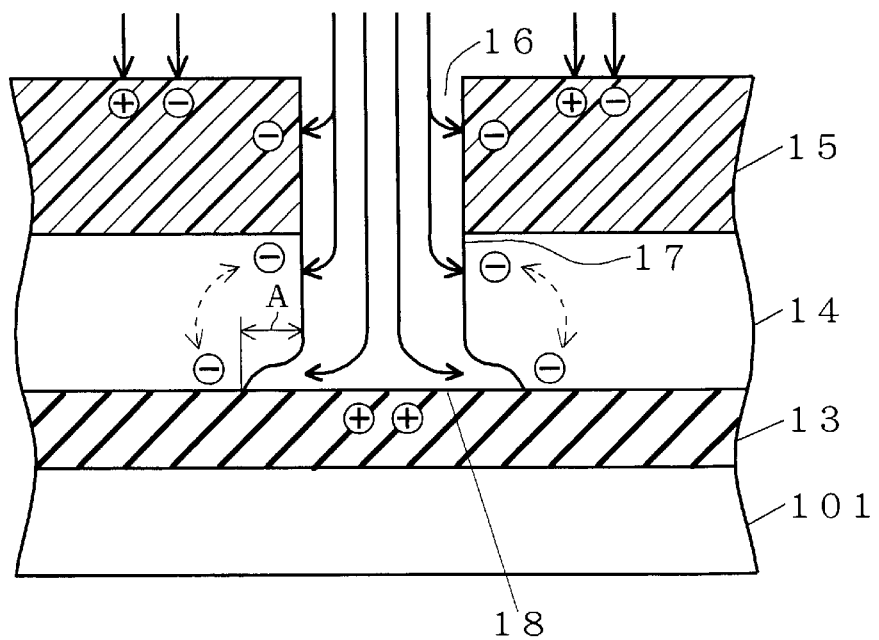

FIG. 18 is a timing chart showing correlation between the μ wave 19 and the RF power. It becomes possible to control microscopic ion energy as well as a notch amount by controlling a delay time t0. The delay time t0 is defined as how long the beginning of superimposition of RF components on DC components (floating potential Vf) delays from the beginning of intermittent ON period of the μ wave 19. FIG. 19 is a graph showing correlation between the delay time t0 and a notch amount, where a cycle of the μ wave is T (duty 50%) and the period of superimposition of the RF components on the DC components is τ (when initial phase α=0°). As it is obvious from the graph, a notch amount can be remarkably reduced by setting the timing of superimposition of the RF components on the DC components near the end of the OFF period of the μ wave.

The plasma density thins in such timing, which results in small amount of electrons. That is, when there is no difference in power of the RF components, each electron has maximum power. Thus, it is possible to obtain the most remarkable effect that the electrons are induced into the bottom portion of the pattern to offset charge.

Though only the ECR etching apparatuses are explained in the aforementioned preferred embodiments, the application of the present invention is not only limited to those apparatuses. The present invention is also applicable to all kinds of etching apparatuses for generating plasma separately from an RF power applied to a sample (e.g. etching apparatus using an induced coupled plasma, called as "ICP"). It is needless to say that control of the frequency of the RF power and a voltage is effective in controlling an ion energy and a notch amount.

While the invention has been described in detail, the foregoing description is in all aspects illustrative and not restrictive. It is understood that numerous other modifications and variations can be devised without departing from the scope of the invention.

We claim:

1. A plasma reactor comprising:
    a stage;
    a frequency-only modulated RF power supply connected to said stage for applying substantially constant amplitude frequency-only modulated RF power; and
    a reaction chamber containing plasma exposed to a sample mounted on said stage;
    wherein said BY power supply comprises means for generating said RF power in cycles, each one of said cycles consisting of first and second subcycles, said first subcycle having plural repetitions of a waveform having a first constant frequency and said second subcycle having plural repetitions of a waveform with a second constant frequency different from said first constant frequency.

2. A plasma reactor comprising:
    a stage;
    a reaction chamber containing plasma exposed to a sample on said stage; and
    an RF power supply connected to said stage and supplying RF power having repeating cycles, each one of the cycles consisting of a plurality of first and second subcycles with said RF power of different amplitudes, one of said plurality of first and second subcycles having an amplitude of zero and the other of said subcycles having plural repetitions of a waveform of constant frequency;
    wherein said plurality of first subcycles have different lengths, respectively.

3. The plasma reactor according to claim 2,
    wherein said RF power supply is configured to supply an RF power having an amplitude of zero in said plurality of first subcycles.

4. The plasma reactor according to claim 2,
    wherein said RF power supply is configured to supply an RF power having an amplitude of zero in said plurality of second subcycles.

5. A method of forming a semiconductor substrate by exposing it to plasma, said method comprising:
    a step of applying a substantially constant amplitude frequency-only modulated RF power to said semiconductor substrate on a side opposite to a side exposed to said plasma, wherein said RF power is generated in cycles, each cycle consisting of first and second subcycles, said first subcycle having plural repetitions of a waveform having a first constant frequency and said second subcycle having plural repetitions of a waveform with a second constant frequency different from said first constant frequency.

6. A method of forming a semiconductor substrate by exposing it to a plasma, said method comprising:
    a step of applying RF power to said semiconductor substrate on the opposite side exposed to said plasma, wherein
    said RF power fluctuates in repeating cycles, each one of the cycles consisting of a plurality of first and second subcycles with said RF power of different amplitudes, each subcycle of one of said first and second subcycles having an amplitude of zero and each subcycle of the other of said first and second subcycles having constant frequency; and
    said plurality of first subcycles have different lengths.

7. The method of forming a semiconductor substrate according to claim 6, wherein
    said semiconductor substrate includes an insulating layer,
    said method comprising determining a length of at least one of said first and second subcycles based upon charging of said insulating layer by said plasma.

8. The method of forming a semiconductor substrate according to claim 7, comprising:
    determining said length of at least one of said first and second subcycles based upon a saturation value of said charging.

9. The method of forming a semiconductor substrate according to claim 6, comprising:
    applying said RF power in said first subcycle;
    turning off said RE power during said second subcycle;
    varying a length of said first subcycle while maintaining a substantially constant length of said second subcycle.

10. The method of forming a semiconductor substrate according to claim 9, wherein said varying step comprises:
    applying said RF power for a first period having a first length;
    applying said RF power for a second period having a second length different than said first length; and
    alternately applying said RF power for said first and second periods, separated by said second subcycle.

11. The method of forming a semiconductor substrate according to claim 9, wherein
    said semiconductor substrate includes an insulating layer,
    said method comprising varying said length of said first subcycle based upon charging of said insulating layer by said plasma.

12. The method of forming a semiconductor substrate according to claim 6, comprising:
    applying said RF power in said first subcycle;
    turning off said RF power during said second subcycle; and
    varying a length of said second subcycle while maintaining a substantially constant length of said first subcycle.

13. The method of forming a semiconductor substrate according to claim 12, wherein said varying step comprises:
    turning off said RF power for a first period having a first length;
    turning off said RF power for a second period having a second length different than said first length; and alternately turning off said RF power for said first and second periods, separated by said first subcycle.

14. The method of forming a semiconductor substrate according to claim 12, wherein said semiconductor substrate includes an insulating layer, said method comprising varying said length of said second subcycle based upon charging of said insulating layer by said plasma.

* * * * *